(12) United States Patent
Li et al.

(10) Patent No.: US 8,680,503 B2
(45) Date of Patent: Mar. 25, 2014

(54) CARBON NANO-FILM REVERSIBLE RESISTANCE-SWITCHABLE ELEMENTS AND METHODS OF FORMING THE SAME

(75) Inventors: Yubao Li, San Jose, CA (US); April D. Schricker, Palo Alto, CA (US)

(73) Assignee: SanDisk 3D LLC, Milpitas, CA (US)

( * ) Notice: Subject to any disclaimer, the term of this patent is extended or adjusted under 35 U.S.C. 154(b) by 69 days.

(21) Appl. No.: 13/416,135

(22) Filed: Mar. 9, 2012

(65) Prior Publication Data

US 2012/0168707 A1 Jul. 5, 2012

Related U.S. Application Data

(62) Division of application No. 12/466,197, filed on May 14, 2009, now Pat. No. 8,133,793.

(60) Provisional application No. 61/054,111, filed on May 16, 2008.

(51) Int. Cl.
*H01L 47/00* (2006.01)

(52) U.S. Cl.
USPC ............ 257/4; 257/529; 438/478; 977/943

(58) Field of Classification Search
USPC .......................................................... 257/4
See application file for complete search history.

(56) References Cited

U.S. PATENT DOCUMENTS

| | | | |
|---|---|---|---|
| 5,629,666 A | 5/1997 | Imai et al. | |
| 6,333,016 B1 | 12/2001 | Resasco et al. | |
| 6,420,092 B1 | 7/2002 | Yang | |
| 6,515,325 B1 | 2/2003 | Farnworth et al. | |
| 6,706,402 B2 | 3/2004 | Ruecks | |
| 6,833,558 B2 | 12/2004 | Lee et al. | |
| 6,863,942 B2 | 3/2005 | Ren et al. | |
| 6,885,021 B2 | 4/2005 | Apodaca et al. | |
| 6,919,592 B2 | 7/2005 | Segal et al. | |
| 6,952,030 B2 | 10/2005 | Herner et al. | |
| 6,969,651 B1 | 11/2005 | Lu et al. | |
| 6,986,877 B2 | 1/2006 | Takikawa et al. | |
| 7,056,758 B2 | 6/2006 | Segal et al. | |
| 7,084,062 B1 | 8/2006 | Avanzino et al. | |
| 7,224,033 B2 | 5/2007 | Zhu et al. | |
| 7,285,464 B2 | 10/2007 | Herner et al. | |
| 7,301,191 B1 | 11/2007 | Tombler et al. | |

(Continued)

FOREIGN PATENT DOCUMENTS

| | | |
|---|---|---|
| EP | 1 361 608 | 11/2003 |
| EP | 1 739 753 | 1/2007 |

(Continued)

OTHER PUBLICATIONS

Gerstner et al., "Nonvolatile Memory Effects in Nitrogen Doped Tetrahedral Amorphous Carbon Thin Films", Nov. 15, 1998, Journal of Applied Physics, vol. 84, No. 10, pp. 5647-5651.

(Continued)

*Primary Examiner* — Matthew W Such
*Assistant Examiner* — Robert Carpenter
(74) *Attorney, Agent, or Firm* — Dugan & Dugan, PC

(57) ABSTRACT

Methods of forming a microelectronic structure are provided, the microelectronic structure including a first conductor, a discontinuous film of metal nanoparticles disposed on a surface above the first conductor, a carbon nano-film formed atop the surface and the discontinuous film of metal nanoparticles, and a second conductor disposed above the carbon nano-film. Numerous additional aspects are provided.

15 Claims, 11 Drawing Sheets

(56) References Cited

U.S. PATENT DOCUMENTS

| | | |
|---|---|---|
| 7,345,296 B2 | 3/2008 | Tombler, Jr. et al. |
| 7,374,987 B2 | 5/2008 | Chidambarrao et al. |
| 7,390,726 B1 | 6/2008 | Issaq et al. |
| 7,405,465 B2 | 7/2008 | Herner |
| 7,483,285 B2 | 1/2009 | Furukawa et al. |
| 7,560,136 B2 | 7/2009 | Ward et al. |
| 7,575,984 B2 | 8/2009 | Radigan |
| 7,615,432 B2 | 11/2009 | Kim et al. |
| 7,618,300 B2 | 11/2009 | Liu et al. |
| 7,768,016 B2 | 8/2010 | Kreupl |
| 2003/0021966 A1 | 1/2003 | Segal et al. |
| 2003/0073295 A1 | 4/2003 | Xu |
| 2003/0222560 A1 | 12/2003 | Roach |
| 2004/0159835 A1 | 8/2004 | Krieger et al. |
| 2005/0019494 A1 | 1/2005 | Moghadam et al. |
| 2005/0052915 A1 | 3/2005 | Herner |
| 2005/0148271 A1 | 7/2005 | Yaniv et al. |
| 2005/0226067 A1 | 10/2005 | Herner et al. |
| 2006/0038212 A1 | 2/2006 | Moore et al. |
| 2006/0097342 A1 | 5/2006 | Parkinson |
| 2006/0234418 A1 | 10/2006 | Ufert |
| 2006/0250836 A1 | 11/2006 | Herner |
| 2006/0269692 A1 | 11/2006 | Balseanu et al. |
| 2007/0020919 A1 | 1/2007 | Adem et al. |
| 2007/0122621 A1 | 5/2007 | Kreupl et al. |
| 2007/0128858 A1 | 6/2007 | Haukka |
| 2007/0190722 A1 | 8/2007 | Herner |
| 2007/0200243 A1 | 8/2007 | Kraus et al. |
| 2007/0221998 A1 | 9/2007 | Park |
| 2007/0252131 A1 | 11/2007 | Tong et al. |
| 2007/0268042 A1 | 11/2007 | Paul |
| 2007/0269992 A1 | 11/2007 | Yang et al. |
| 2008/0026523 A1 | 1/2008 | Lee et al. |
| 2008/0061283 A1 | 3/2008 | Taguchi |
| 2008/0070162 A1 | 3/2008 | Ufert |
| 2008/0099752 A1 | 5/2008 | Kreupl et al. |
| 2008/0101121 A1 | 5/2008 | Kreupl |
| 2008/0107892 A1 | 5/2008 | Jiao et al. |
| 2008/0135834 A1 | 6/2008 | Kaza et al. |
| 2008/0173858 A1 | 7/2008 | An et al. |
| 2008/0210923 A1 | 9/2008 | Sato |
| 2008/0230826 A1 | 9/2008 | Das |
| 2008/0233396 A1 | 9/2008 | Raravikar |
| 2008/0237599 A1 | 10/2008 | Herner et al. |
| 2008/0237733 A1 | 10/2008 | Chen et al. |
| 2008/0239790 A1 | 10/2008 | Herner |
| 2008/0308785 A1 | 12/2008 | Park et al. |
| 2009/0017640 A1 | 1/2009 | Huh et al. |
| 2009/0166609 A1 | 7/2009 | Schricker |
| 2009/0166610 A1 | 7/2009 | Schricker |
| 2009/0168491 A1 | 7/2009 | Schricker |
| 2009/0213643 A1 | 8/2009 | Angerbauer et al. |
| 2009/0225588 A1 | 9/2009 | Czubatyj et al. |
| 2009/0256132 A1 | 10/2009 | Scheuerlein |
| 2009/0257270 A1 | 10/2009 | Schricker |
| 2009/0263972 A1 | 10/2009 | Balseanu et al. |
| 2009/0278112 A1 | 11/2009 | Schricker et al. |
| 2009/0283735 A1 | 11/2009 | Li et al. |
| 2010/0001267 A1 | 1/2010 | Manning et al. |
| 2010/0006811 A1 | 1/2010 | Xu et al. |
| 2010/0006812 A1 | 1/2010 | Xu |
| 2010/0008122 A1 | 1/2010 | Tilke |
| 2010/0012912 A1 | 1/2010 | Schricker |
| 2010/0019317 A1 | 1/2010 | Moroz et al. |
| 2010/0032638 A1 | 2/2010 | Xu |
| 2010/0032643 A1 | 2/2010 | Xu |
| 2010/0078759 A1 | 4/2010 | Sekar et al. |
| 2010/0102291 A1 | 4/2010 | Xu |
| 2010/0108976 A1 | 5/2010 | Jayasekara et al. |
| 2010/0108981 A1 | 5/2010 | Jayasekara |
| 2010/0108982 A1 | 5/2010 | Ping et al. |
| 2010/0117041 A1 | 5/2010 | Hwang et al. |
| 2010/0245029 A1 | 9/2010 | Schricker et al. |
| 2011/0254126 A1 | 10/2011 | Kreupl et al. |
| 2011/0278529 A1 | 11/2011 | Xu |

FOREIGN PATENT DOCUMENTS

| | | |
|---|---|---|
| EP | 1 892 722 | 2/2008 |
| EP | 1 916 722 | 4/2008 |
| JP | 2006/063369 | 3/2006 |
| WO | WO 2004/070735 | 8/2004 |
| WO | WO 2005/045871 | 5/2005 |
| WO | WO 2006/049834 | 5/2006 |
| WO | WO 2006/078505 | 7/2006 |
| WO | WO 2006/079979 | 8/2006 |
| WO | WO 2007/130913 | 11/2007 |
| WO | WO 2008/021900 | 2/2008 |
| WO | WO 2008/036385 | 3/2008 |
| WO | WO 2009/088890 | 7/2009 |
| WO | WO 2009/137222 | 11/2009 |
| WO | WO 2010/017427 | 2/2010 |
| WO | WO 2010/048408 | 4/2010 |

OTHER PUBLICATIONS

Takai et al.,"Structure and Electronic Properties of a Nongraphitic Disordered Carbon System and its Heat-Treatment Effects", 2003, Physical Review B 67, 214202, pp. 214202-1-214202-11.

Bhattacharyya, et al., "Resonant Tunnelling and Fast Switching in Amorphous-Carbon Quantum-Well Structures," Dec. 2005, Nanoelectronics Centre, Advanced Technology Institute, pp. 19-22.

Dittmer et al., "Low ambient temperature CVD growth of carbon nanotubes," Appl. Phys. A 84, 2006, p. 1.

Kodama et al., "Properties of Amorphous Carbon Films Synthesized by Atmospheric Pressure Glow Plasma CVD Method," Journal of Photopolymer Science and Technology, vol. 19, No. 5, 2006, pp. 673-678.

Kong et al., "Integration of a gate electrode into carbon nanotube devices for scanning tunneling microscopy," Appl. Phys. Lett. 86, 2005, pp. 112106-1-112106-3.

Bhattacharyya, et al., "Switching behaviour and high frequency response of amorphous carbon double-barrier structures" Aug. 2007, Materials Science and Engineering C, Elsevier Science S.A, CH, vol. 27 No. 5-8, pp. 957-960.

Leroy et al., "Thin film solid-state reactions forming carbides as contact materials for carbon-containing semiconductors", Journal of Applied Physics, vol. 101, No. 5, (2007) pp. 053714-1-053714-10.

Grill, "Plasma-deposited Diamondlike Carbon and Related Materials", Jan./Mar. 1999; IBM J. Res. Develop. vol. 43 No. 1/2, pp. 147-162.

International Search Report and Written Opinion of International Application No. PCT/US2009/044145 mailed Aug. 24, 2009.

Budnik et al., "A High Density, Carbon Nanotube Capacitor for Decoupling Applications", DAC 2006, Jul. 24-28, 2006, pp. 935-938.

Engelsen, "The temptation of field emission displays", Physics Procedia 1 (2008), pp. 355-365.

Restriction Requirement of U.S. Appl. No. 12/466,197 mailed Aug. 23, 2010.

Aug. 27, 2010 Reply to Aug. 23, 2010 Restriction Requirement of U.S. Appl. No. 12/466,197.

Office Action of U.S. Appl. No. 12/466,197 mailed Nov. 4, 2010.

Communication pursuant to Rules 161(1) and 162 EPC of European Application No. 09747677.4 dated Dec. 29, 2010.

Feb. 4, 2011 Reply to Nov. 4, 2010 Office Action of related U.S. Appl. No. 12/466,197.

Feb. 1, 2011 Reply to Dec. 29, 2010 Communication pursuant to Rules 161(1) and 162 EPC of related European Application No. 09747677.4.

Notice of Allowance and Examiner Interview Summary of related U.S. Appl. No. 12/466,197 dated Mar. 23, 2011.

Notice of Allowance of related U.S. Appl. No. 12/466,197 dated May 27, 2011.

Notice of Allowance of related U.S. Appl. No. 12/466,197 dated Aug. 22, 2011.

Murarka, S.P., et al. "Effect of Growth Parameters on the CVD of Boron Nitride and Phosphorus-Doped Boron Nitride." J. Electrochem. Soc.:Sol.-State Sci. & Technol., vol. 126, No. 11 (1979) pp. 1951-1957.

(56) References Cited

OTHER PUBLICATIONS

Notice of Allowance of related U.S. Appl. No. 12/466,197 dated Nov. 28, 2011.
Notice of Allowance of related U.S. Appl. No. 12/466,197 dated Dec. 28, 2011.
Robertson, J., "Diamond-like amorphous carbon", 2002, Materials Science and Engineering, R 37, pp. 129-281.
Kanicki, J, "Role of Hydrogen in silicon nitride films prepared by various deposition techniques", 1988, MRS Proceedings 118, 671.
Office Action of China Patent Application No. 200980117734.5 dated Mar. 23, 2012.
Aug. 3, 2012 Reply to Office Action of China Patent Application No. 200980117734.5.

US 8,680,503 B2

CARBON NANO-FILM REVERSIBLE RESISTANCE-SWITCHABLE ELEMENTS AND METHODS OF FORMING THE SAME

CROSS-REFERENCE TO RELATED APPLICATIONS

This application is a divisional of U.S. patent application Ser. No. 12/466,197, filed May 14, 2009, now U.S. Pat. No. 8,133,793, which claims the benefit of U.S. Provisional Patent Application Ser. No. 61/054,111, filed May 16, 2008 (hereinafter "the '111 Application"), each of which hereby is incorporated by reference herein in its entirety for all purposes.

The present application is related to the following patent applications, each of which is hereby incorporated by reference herein in its entirety for all purposes:

U.S. patent application Ser. No. 11/968,156, filed on Dec. 31, 2007, and titled "Memory Cell That Employs A Selectively Fabricated Carbon Nano-Tube Reversible Resistance-Switching Element Formed On A Bottom Conductor And Methods Of Forming The Same" (hereinafter "the '156 Application").

U.S. patent application Ser. No. 11/968,159, filed on Dec. 31, 2007, and titled "Memory Cell With Planarized Carbon Nanotube Layer And Methods Of Forming The Same" (hereinafter "the '159 Application").

U.S. Provisional Patent Application Ser. No. 61/044,352, filed Apr. 11, 2008, and titled "Damascene Integration Methods For Graphitic Films In Three-Dimensional Memories And Memories Formed Therefrom" (hereinafter "the '352 Application").

BACKGROUND

The present invention relates to microelectronic structures, such as non-volatile memories, and specifically relates to carbon nano-film reversible resistance-switchable elements and methods of forming the same. Non-volatile memories formed from reversible resistance-switching elements are known. For example, U.S. patent application Ser. No. 11/125,939, filed May 9, 2005 and titled "Rewriteable Memory Cell Comprising A Diode And A Resistance-Switching Material" (hereinafter "the '939 Application"), which is hereby incorporated by reference herein in its entirety for all purposes, describes a rewriteable non-volatile memory cell that includes a diode coupled in series with a reversible resistivity-switching material such as a metal oxide or metal nitride.

It is also known that certain carbon-based films may exhibit reversible resistivity-switching properties, making such films candidates for integration within a three-dimensional memory array. For example, U.S. patent application Ser. No. 11/968,154, filed Dec. 31, 2007, titled "Memory Cell That Employs A Selectively Fabricated Carbon Nano-Tube Reversible Resistance-Switching Element And Methods Of Forming The Same" (hereinafter "the '154 Application"), which is hereby incorporated by reference herein in its entirety for all purposes, describes a rewriteable non-volatile memory cell that includes a diode coupled in series with a carbon-based reversible resistivity-switchable material.

However, fabricating memory devices from rewriteable resistivity-switching materials is technically challenging, and improved methods of forming memory devices that employ resistivity-switching materials are desirable.

SUMMARY

In a first aspect of the invention, a microelectronic structure is provided that includes (1) a first conductor; (2) a discontinuous film of metal nanoparticles disposed on a surface above the first conductor; (3) a carbon nano-film formed atop the surface and the discontinuous film of metal nanoparticles; and (4) a second conductor disposed above the carbon nano-film.

In a second aspect of the invention, a memory cell is provided that includes (1) a first conductor; (2) a discontinuous film of metal nanoparticles disposed on a surface above the first conductor; (3) a carbon nano-film formed atop the surface and the discontinuous film of metal nanoparticles; and (4) a second conductor disposed above the carbon nano-film.

Other features and aspects of this invention will become more fully apparent from the following detailed description, the appended claims and the accompanying drawings.

BRIEF DESCRIPTION OF THE DRAWINGS

Features of the present invention can be more clearly understood from the following detailed description considered in conjunction with the following drawings, in which the same reference numerals denote the same elements throughout.

It is to be noted, however, that the appended drawings illustrate only typical embodiments of this invention. The drawings are not necessarily drawn to scale. They should not be considered limiting of the scope of the invention, for the invention may admit to other equally effective embodiments.

DETAILED DESCRIPTION

As introduced above, a memory cell may be formed using a reversible resistance-switching element coupled to a steering element, such as a diode. Some carbon nano-film materials, such as graphene, have been shown to exhibit reversible resistivity-switching properties that may be suitable for use in non-volatile memory cell devices. Graphene formation, however, can be technically challenging, especially when formation of graphene is attempted on dielectric materials. Inasmuch as memory arrays conventionally include numerous memory cells separated by high proportions of dielectric material, methods in accordance with this invention promote graphene formation by forming metal nanoparticles on a surface of the dielectric material prior to graphene formation.

The metal nanoparticles form a discontinuous metal film on the surface of the substrate. Due to intentional discontinuities in the metal nanoparticle film, the film does not interconduct between, e.g., short, electrically active areas. The discontinuous metal film increases the surface area of exposed metal amid the dielectric, such as silicon dioxide ("$SiO_2$" or "$SiO_x$"), thereby also increasing the metal-surface-area-to-dielectric-surface-area ratio. Experimental data indicate that such use of metal nanoparticles may improve graphene growth on surfaces that contain large proportions of dielectric material.

By improving the surface area ratio of metal to dielectric, graphene deposition is improved on surfaces of structures with materials and pattern densities that are similar to commercial products. Whereas conventional graphene growth on dielectric materials without metal nanoparticles may achieve less reliable results, graphene growth promoted by metallic nanoparticles on dielectric surfaces may result in significantly higher switching device yield and run-to-run reproducibility in embodiments similar to commercial memory arrays.

Metal Nanoparticles Assisting Graphene Growth

Figure 1A:
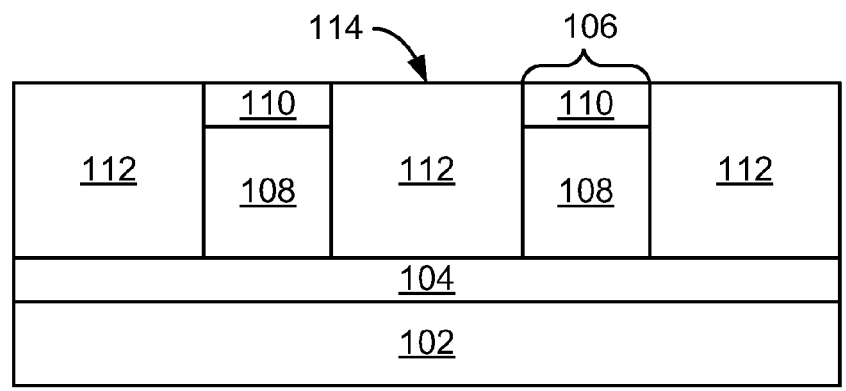
FIGS. 1A-1C are cross-sectional, elevational views of a microelectronic structure during an exemplary inventive method of metal-nanoparticle-assisted growth of graphene on a substantially planar and horizontal surface having significant dielectric surface area.
Figure 1B:
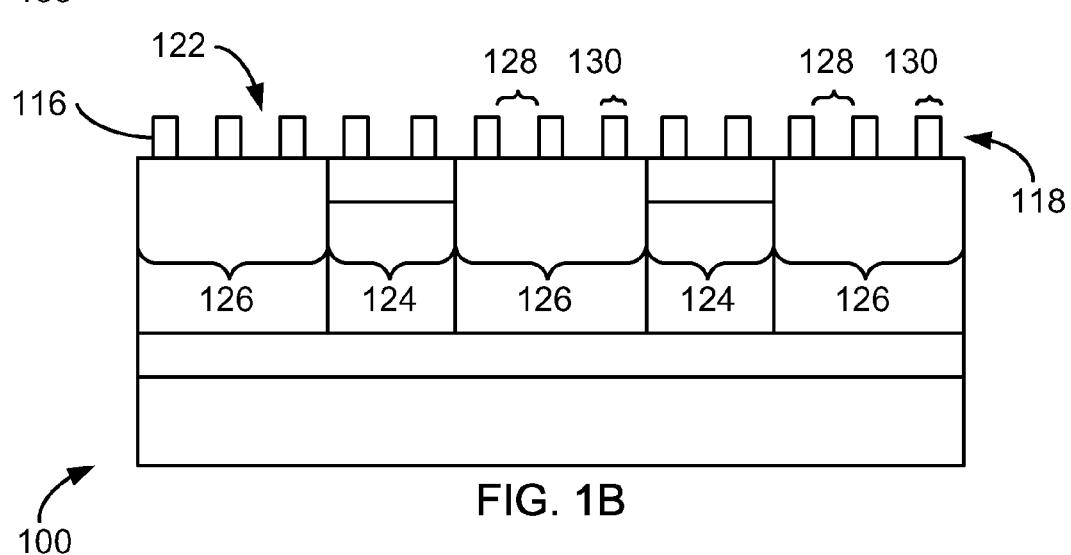
Figure 1C:
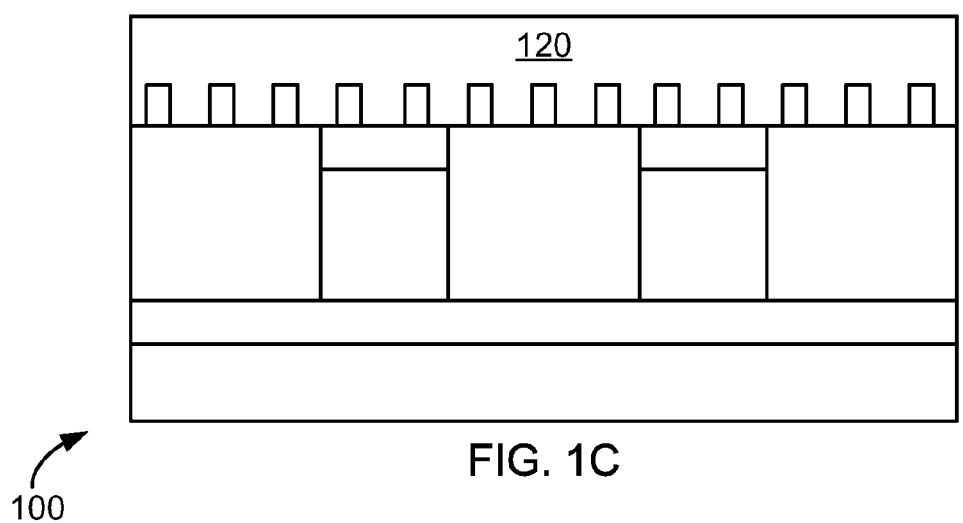

FIGS. 1A-1C depict cross-sectional, elevational views of a microelectronic structure 100 including a substrate during an exemplary embodiment of metal-nanoparticle-assisted growth of graphene on a substantially planar and horizontal surface having significant dielectric surface area. Microelectronic structure 100 might comprise, for example, initial stages of metal-insulator-metal ("MIM") stacks within memory cells interconnected by conductors and disposed in a memory array.

FIG. 1A depicts a substrate 102 having a dielectric layer 104, such as silicon dioxide or any other suitable dielectric, with lower conductors 106 extending into the page. The selection of layers of the depicted structure 100, such as inclusion of substrate 102 and dielectric layer 104 above substrate 102, is intended to provide context without limiting possible structural embodiments. Lower conductors 106 may be made of any suitable conducting material 108, such as tungsten ("W"), and may have a suitable barrier layer 110, such as titanium nitride ("TiN"). FIG. 1A depicts structure 100 after lower conductors 106 have been patterned and etched, gaps between lower conductors 106 have been filled with dielectric material 112 (such as $SiO_2$), and a top surface 114 has been planarized.

FIG. 1B shows metal nanoparticles 116, depicted as rectangles comprising, for instance, tungsten, as having been deposited on top surface 114 of structure 100. Note that the figures are not drawn to scale or intended to represent any fixed proportionality between relative dimensions. According to some embodiments of the present invention, metal nanoparticles 116 are deposited onto top surface 114 in the form of a discontinuous metal film 118, prior to growth of a graphene layer 120 (see FIG. 1C). Film 118 preferably is non-conductive laterally across film 118, as applied, to avoid a potential for shorting the intended electrical circuits.

After formation of discontinuous film 118, top surface 114 becomes an exposed surface 122 that is not entirely planar. Exposed surface 122 includes areas having metal surfaces 124 and areas having primarily dielectric surfaces 126. Metal surfaces 124 may have metal nanoparticles 116 atop planarized metal material, e.g., layer 108 or 110. The primarily dielectric surfaces 126 are portions of top surface 114 having metal nanoparticles 116 atop planarized dielectric material 112. As such, the primarily dielectric surfaces 126 are not characterized as wholly dielectric surfaces. In some embodiments, primarily dielectric surfaces 126 have a surface area of exposed dielectric material 128 greater than a surface area of exposed metal nanoparticles 130.

An exemplary method of forming metal nanoparticles involves quickly depositing a very fine dispersion of metal. For example, tungsten metal may be deposited under vacuum (e.g., $1 \times 10^{-5}$ torr) using plasma assisted sputtering techniques (e.g., 20 W power), such as for 4 seconds of deposition time. Likewise, physical vapor deposition ("PVD") may be used with a pressure of between $1 \times 10^{-9}$ torr and $1 \times 10^{-2}$ torr, with a power of between 5 watts and 8 kilowatts, and for a duration of between 1 second and 60 seconds (duration tends to vary with pressure). For instance, a discontinuous film may be formed using PVD for 2 seconds at a power of 8 kW and a pressure of $1 \times 10^{-4}$ torr to $1 \times 10^{-3}$ torr. Other processing conditions may be used. Other deposition techniques such as chemical vapor deposition ("CVD"), plasma enhanced CVD ("PECVD"), Ebeam sputtering, and atomic layer deposition ("ALD") may be used. Other deposition metals that may be used include: molybdenum ("Mo"), tungsten nitride ("WN"), titanium ("Ti"), TiN, tantalum ("Ta"), tantalum nitride ("TaN"), aluminum ("Al"), aluminum oxide ("$Al_2O_3$"), copper ("Cu"), chromium ("Cr"), titanium aluminum oxide ("TiAlN"), nickel ("Ni"), ruthenium ("Ru"), cobalt ("Co"), iron ("Fe"), etc.

Optimal thicknesses of film 118 include a single monolayer of metal up to about 20 nm, with the preferred thickness being about 1 nm. Metal nanoparticles 116 may have a diameter of about 0.1 to about 20 nm, in some embodiments. Other thickness and/or diameter ranges may be used. FIG. 1B depicts in schematic form an example in accordance with the present invention of a structure with deposited metal nanoparticles 116 prior to growth of a graphene layer 120.

In some embodiments, metal nanoparticles 116 may be formed by sintering a continuous or discontinuous metal film. The sintering may be performed, for instance, in an inert or reducing atmosphere. Sintering may cause neighboring metal atoms to coalesce together into nanoparticles, causing the metal film to become discontinuous, or become more discontinuous if already somewhat discontinuous. Parameters used in sintering generally are specific to the material to be sintered, but sintering typically involves heating the material below its melting point (solid state sintering) until its particles adhere to each other. For example, nickel has a melting temperature of 1453° C., and a thin film of Ni may be sintered at about 700° C., at a pressure of about $1 \times 10^{-2}$ T, in a reducing atmosphere, such as ammonia gas ("$NH_3$"), hydrogen gas ("$H_2$"), argon gas ("Ar"), or nitrogen gas ("$N_2$").

Following the deposition of metal nanoparticles 116, a graphene layer 120 is grown. Graphene growth may be done by any suitable technique, such as CVD or PECVD. In a preferred embodiment discussed in more detail below, graphene growth may occur by low temperature CVD without plasma enhancement in a conditioned chamber. One or more molecular sheets of graphene may be formed. At the molecular level, graphene is a one-atom-thick planar sheet of $sp^2$-bonded carbon atoms that are densely packed in a honeycomb crystal lattice. This lattice may resemble an atomic-scale chicken-wire netting made of carbon atoms and their bonds. In practice, carbon nano-films in accordance with the invention may include one or more such one-atom-thick planar sheets of $sp^2$-bonded carbon atoms, and multiple such sheets may overlap each other or stack atop each other to form the carbon nano-film.

FIG. 1C depicts the structure 100 after growth of graphene layer 120. Growth of graphene layer 120 may occur in a non-conditioned deposition chamber, but preferably is done in a conditioned deposition chamber (e.g., the graphene deposition chamber initially may be conditioned if it has not been used for the day). As explained in greater detail below, an exemplary target temperature is about 650° C., although other values may be used. After conditioning the chamber, structure 100 with metal nanoparticles 116 is loaded into the graphene deposition chamber and annealed (e.g., in hydrogen gas, argon gas, nitrogen gas, inert environment, vacuum, or other suitable environment) prior to deposition. Deposition of graphene 120 then occurs and may be accomplished, for example, by introducing acetylene and $H_2$ or another suitable chemistry into the chamber. After graphene deposition is completed, a graphene layer 120 is formed over the substrate as shown in FIG. 1C. In some embodiments, about one monolayer to about 1000 angstroms, and more preferably about 400 angstroms to about 600 angstroms, of graphene 120 may be employed. Other thicknesses may be used.

Memory Cells Having Metal Nanoparticle-Assisted Graphene

As introduced above, graphitic films that demonstrate resistance-switching are candidates for integration with a steering element, e.g., a diode, in three-dimensional ("3D") read/write ("R/W") memory arrays.

Among other factors, film orientation and thickness each appear to play a role in resistivity-switching functionality. In particular, vertically oriented graphitic films appear to support reversible resistivity switching. For example, the '352 Application describes novel integration schemes that allow carbon graphitic films to be employed with such a vertical orientation. Likewise, thin graphitic films may be integrated in series with a vertical diode to create a re-writable memory device.

In some embodiments, a damascene approach may be employed to form vertically-oriented graphitic films on dielectric sidewalls of a damascene trench or via. In particular, graphitic films may be oriented vertically between two metal layers or conductors, instead of being oriented horizontally within an MIM planar stack, as in FIG. 1. However, formation of vertically-oriented graphitic films on dielectric sidewalls of a damascene trench or via poses the challenge, discussed above, of growing graphene on proportionally large areas of dielectric material. Specifically, the dielectric sidewalls increase the proportion of dielectric surface area. Growth of a graphitic film on the dielectric sidewalls during damascene integration may be promoted by forming a discontinuous film of metal nanoparticles on the sidewalls, as set forth in the following figures.

In at least one embodiment of the invention, a memory cell is provided that includes a CNF reversible resistivity-switching material formed by (1) forming a trench or via in a layer of dielectric; (2) depositing a CNF seeding layer of metal nanoparticles; (3) fabricating a CNF material in the trench or via on the CNF seeding layer; (4) filling the trench or via with dielectric; and (5) planarizing the dielectric to expose CNF material on the sidewalls of the trench or via. The CNF seeding layer may be a layer that facilitates graphene CNF formation, such as a discontinuous, non-interconducting layer of metal nanoparticles. Exemplary CNF seeding materials include tungsten, titanium nitride, tantalum nitride, nickel, cobalt, iron or the like, and in particular, nanoparticles thereof to achieve a discontinuous, non-interconducting layer.

FIGS. 2A-2J depict cross-sectional, elevational views of various stages of fabrication of an exemplary embodiment of a microelectronic structure 200 including a substrate having memory cells fabricated in accordance with the present invention, wherein a reversible resistance-switching element is formed in a damascene trench or via with deposited metal nanoparticles, a carbon nano-film lining and dielectric fill. The metal nanoparticles and graphene are deposited on a substantially non-planar surface having both vertical and horizontal portions.

Figure 2A:
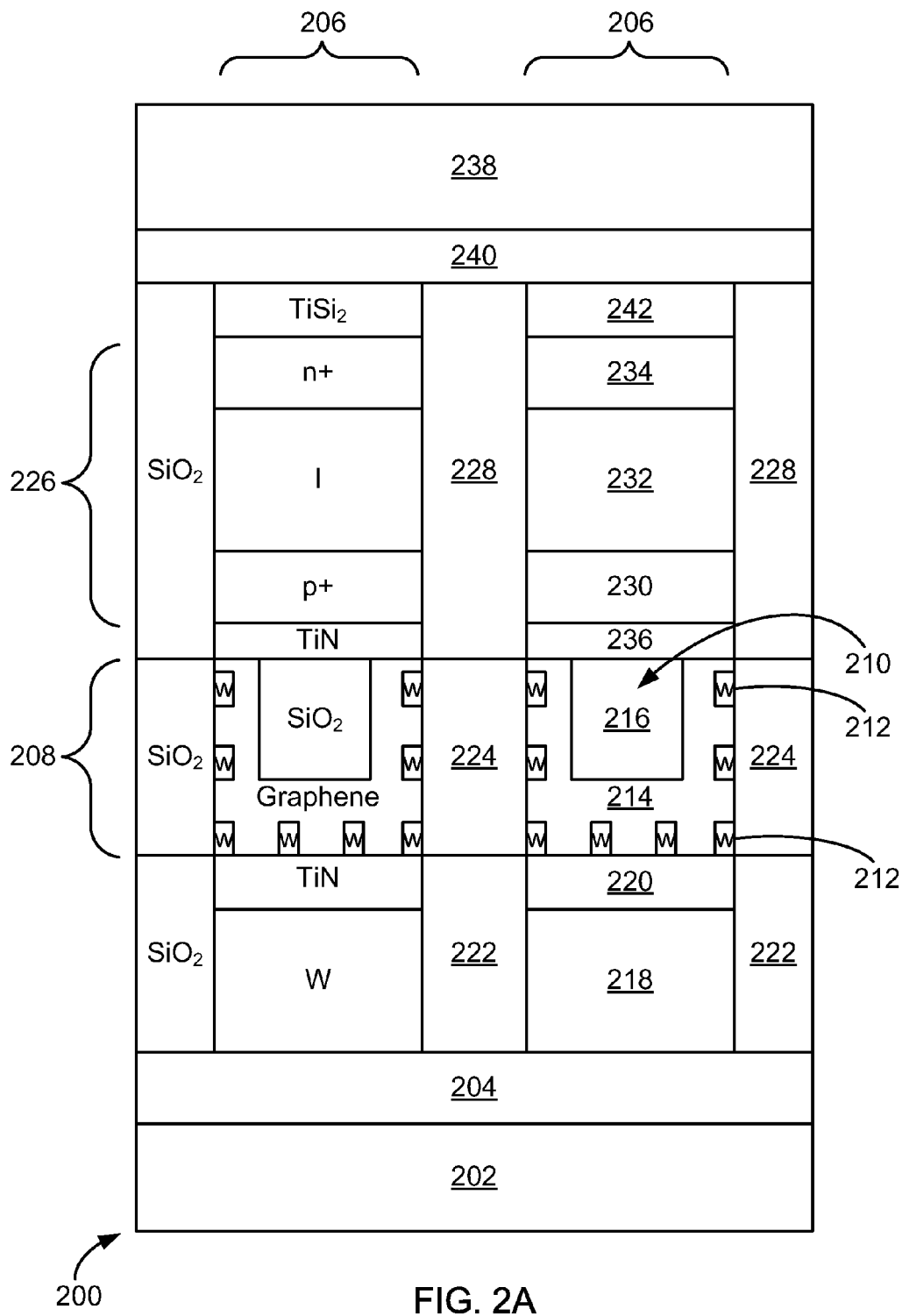
FIG. 2A is a cross-sectional, elevational view of an exemplary embodiment of a microelectronic structure having memory cells fabricated in accordance with the present invention, wherein a reversible resistance-switching element is a damascene trench or via with deposited metal nanoparticles, a carbon nano-film ("CNF") lining and dielectric fill.

FIG. 2A depicts a cross-sectional, elevational view of an exemplary embodiment of the microelectronic structure 200 including a substrate 202 having a dielectric layer 204 and memory cells 206 incorporating concepts of FIGS. 1A-1C, wherein a reversible resistance-switchable element 208 is formed in a damascene trench or via 210 with deposited metal nanoparticles 212 (e.g., W), CNF lining 214 (e.g., graphene) and dielectric fill 216 (e.g., $SiO_2$). As in FIG. 1A, structure 200 includes lower conductors 218 (e.g., W) covered with optional barrier layers 220 (e.g., TiN) and separated with dielectric gap filler 222 (e.g., $SiO_2$). Above optional barrier layers 220 are CNF reversible resistance-switchable elements 208, surrounded by dielectric fill 224 (e.g., $SiO_2$). Above reversible resistance-switchable elements 208 are steering elements 226 (e.g., p-i-n diodes) surrounded by dielectric fill 228 (e.g., $SiO_2$).

Steering element 226 may comprise, for instance, p-i-n diode 226, which may include a p-type layer 230, an i-type layer 232, and an n-type layer 234 of semiconductor material(s). An optional barrier layer 236 may separate steering element 226 from switchable element 208. The choice of steering element 226 is not limited to diodes and may be structures other than diodes, and the choice of diode is not limited to a p-i-n diode. Any junction diode may be used, such as p-n diodes (e.g., without an intrinsic layer 232 "i"), and the positions of the conductivity types (e.g., n-type and p-type) may be exchanged.

Above junction diodes 226 are upper conductors 238, with optional upper barrier layers 240 between diodes 226 and upper conductors 238. Upper conductors 238 preferably are substantially perpendicular to lower conductors 218 and extend left-right in the plane of the page. In addition, an optional silicide-forming layer 242, such as a metal (e.g., Ti), capped with a barrier layer (e.g., TiN), that, once annealed, forms a metal silicide, e.g., titanium silicide ("$TiSi_2$") or tungsten silicide ("$WSi_2$"), may be deposited above pillar diode 226 and below optional barrier layer 240.

An exemplary process according to the present invention for forming the structure of FIG. 2A is depicted in FIGS. 2B-2J. FIGS. 2B-2J are cross-sectional, elevational views of a portion of the substrate of FIG. 2A that show selected stages of fabrication of a single memory level in accordance with the present invention.

Figure 2B:
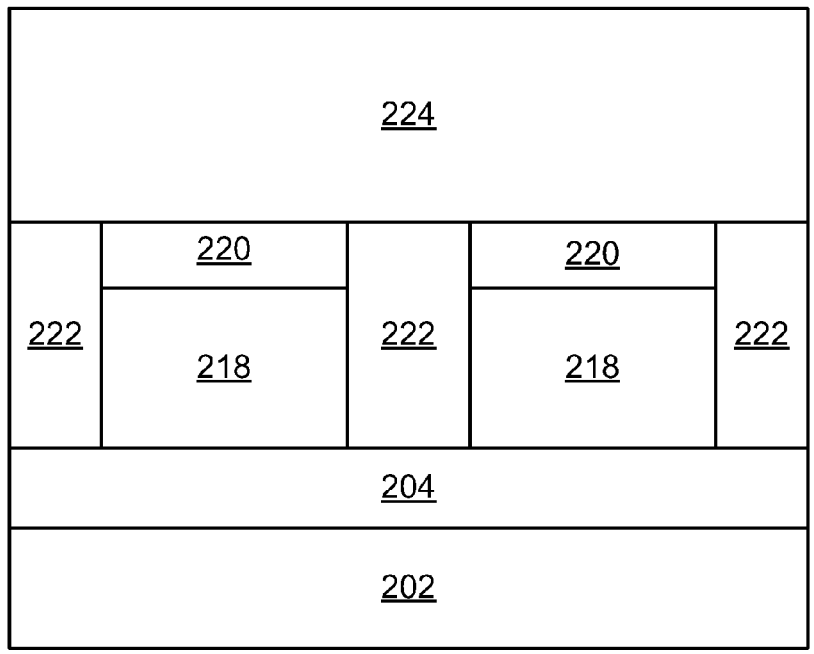
FIGS. 2B-2J are cross-sectional, elevational views of intermediate stages of fabrication of a single memory level on the substrate of FIG. 2A in accordance with the present invention. The metal nanoparticles and CNF are deposited on a substantially non-planar surface having both vertical and horizontal portions.

FIG. 2B shows structure 200B as the beginnings of forming structure 200 of FIG. 2A, using aspects of the process described in forming the structure 100 of FIG. 1A. First, lower conductors 218 and barrier layer 220, surrounded by dielectric material 222, are formed above a dielectric layer 204 above substrate 202. After co-exposing dielectric gap filler 222 and barrier layer 220 by planarization, a dielectric layer 224 comprising a dielectric material, such as SiO$_2$, is formed thereon. Dielectric layer 224 on the top of FIG. 2B is patterned and etched to form trenches or vias 210 above lower conductors 218.

Figure 2C:
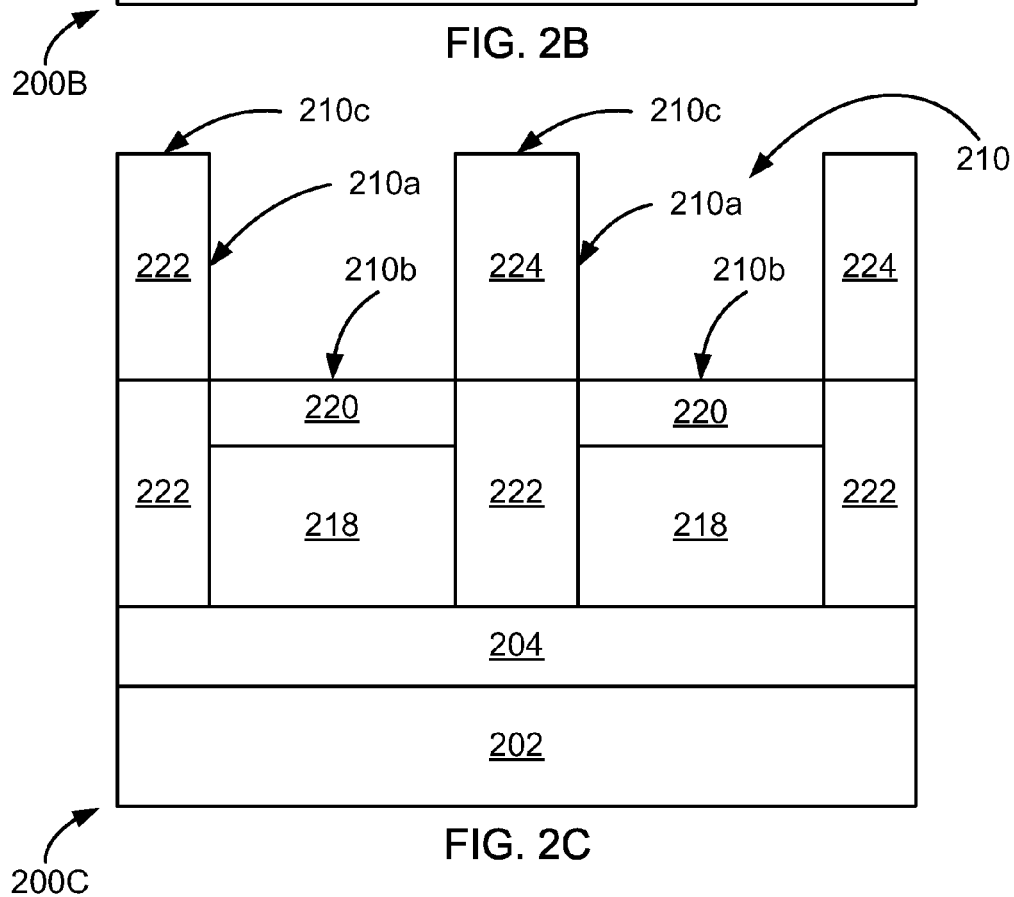

FIG. 2C depicts a structure 200C after formation of trenches or vias 210. Trenches or vias 210 are well-type vacancies, or holes, separated by remaining dielectric material 224. Trenches 210 have sidewalls 210a and bottoms 210b. Sidewalls 210a form vertical portions of the substantially non-planar surface, whereas bottoms 210b and tops 210c form horizontal portions of the substantially non-planar surface.

Figure 2D:
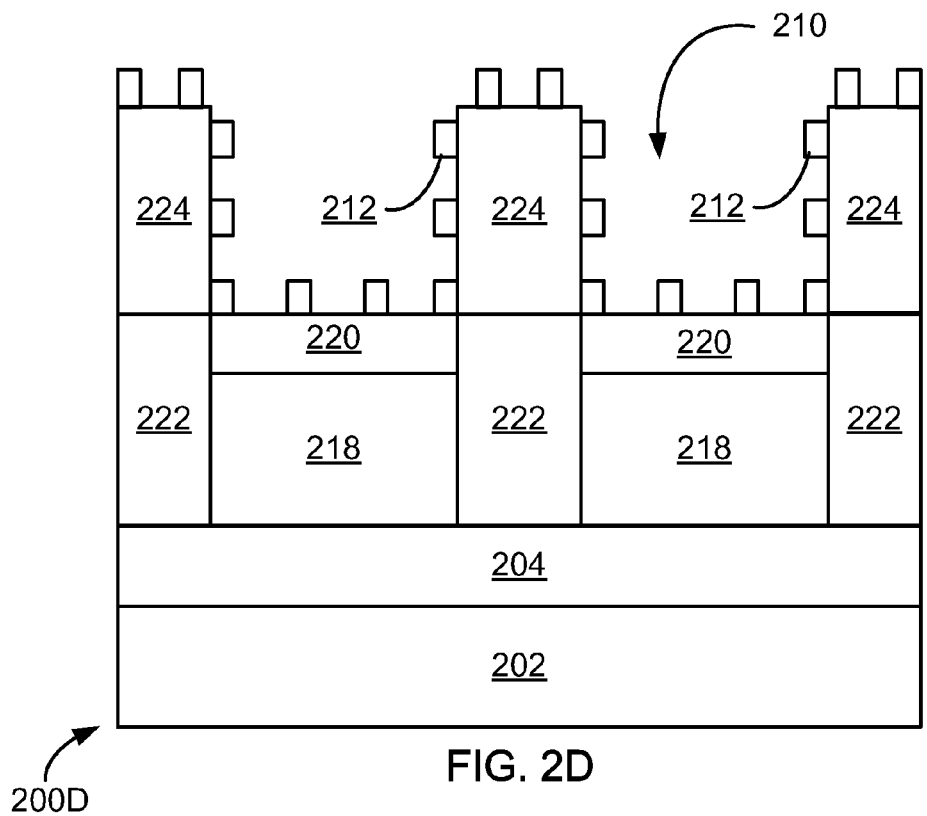

FIG. 2D shows a structure 200D having metal nanoparticles 212 forming a discontinuous metal film on top of structure 200C of FIG. 2C, covering both sidewalls 210a and bottoms 210b of trenches or vias 210 and tops 210c of the remaining dielectric material 224. The discontinuous metal film preferably comprises metal nanoparticles 212, such as made of tungsten, that are deposited in a fashion that covers less than the entire surface area of structure 200C to avoid creating a conducting layer. Metal nanoparticles 212 will adhere to both the horizontal surfaces and vertical surfaces of structure 200C.

Figure 2E:
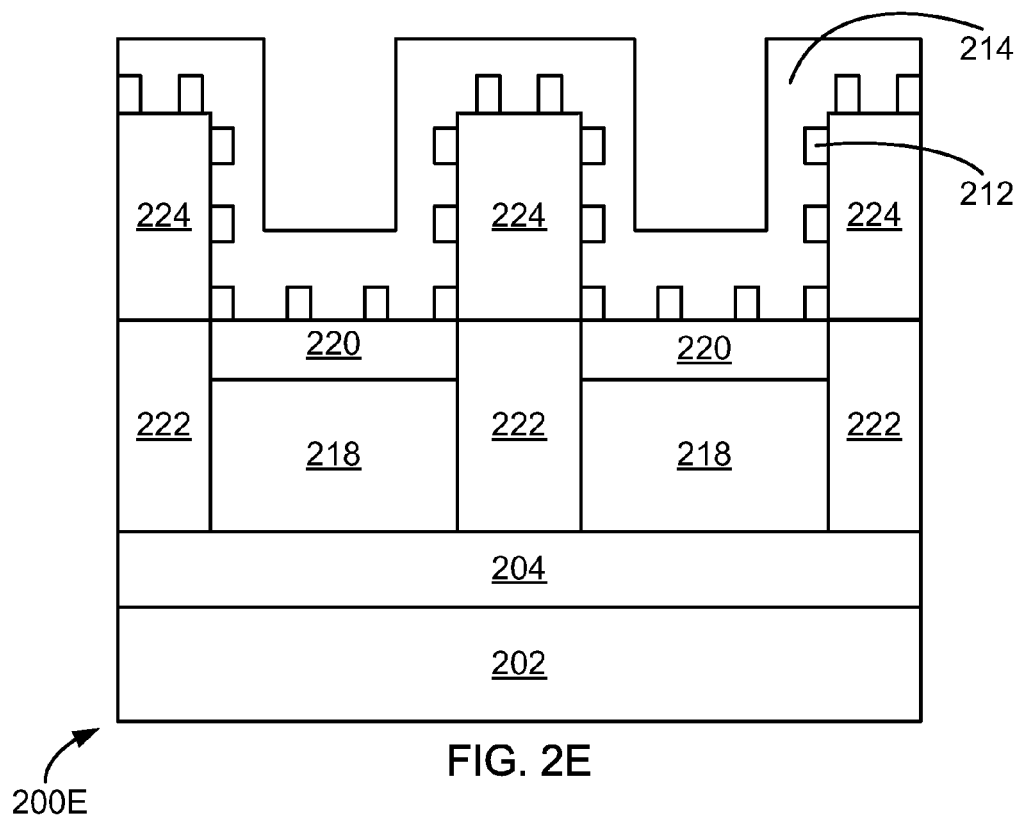

FIG. 2E depicts a carbon graphitic film 214 such as a graphene film as having been grown on structure 200D to form structure 200E. A layer 214 of graphene is an example of a carbon nano-film 214 in accordance with the present invention. The graphene may be deposited, for example, in a chamber having an acetylene and H$_2$ environment, as discussed in more detail below. After the graphene is grown, a dielectric layer 216 is deposited over the graphene, filling any space remaining in trenches or vias 210.

Figure 2F:
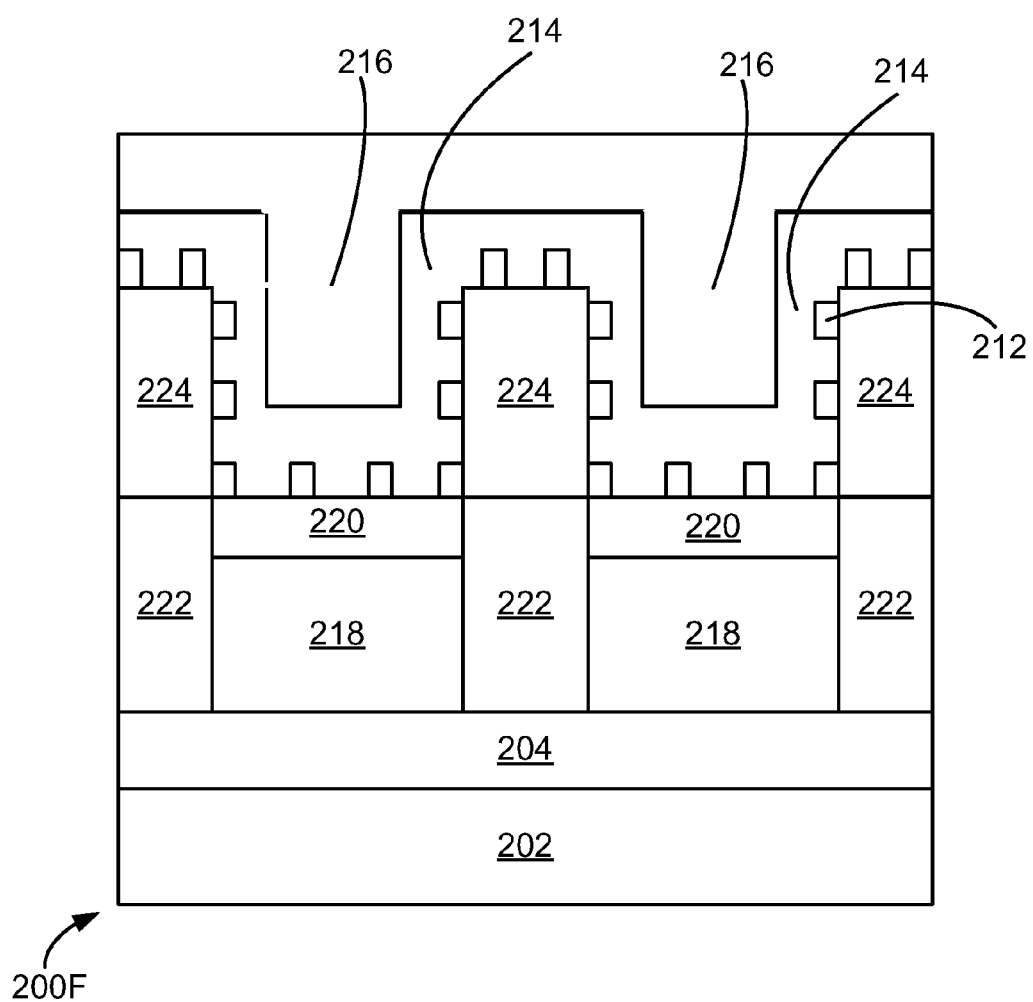

FIG. 2F depicts a structure 200F after dielectric material 216 (e.g., SiO$_2$) has been deposited over graphene layer 214 of structure 200E. With graphene layer 214 in place and any remaining space in trenches or vias 210 filled with dielectric material 216, the top surface of the structure 200F may be planarized to create a structure 200G shown in FIG. 2G.

Figure 2G:
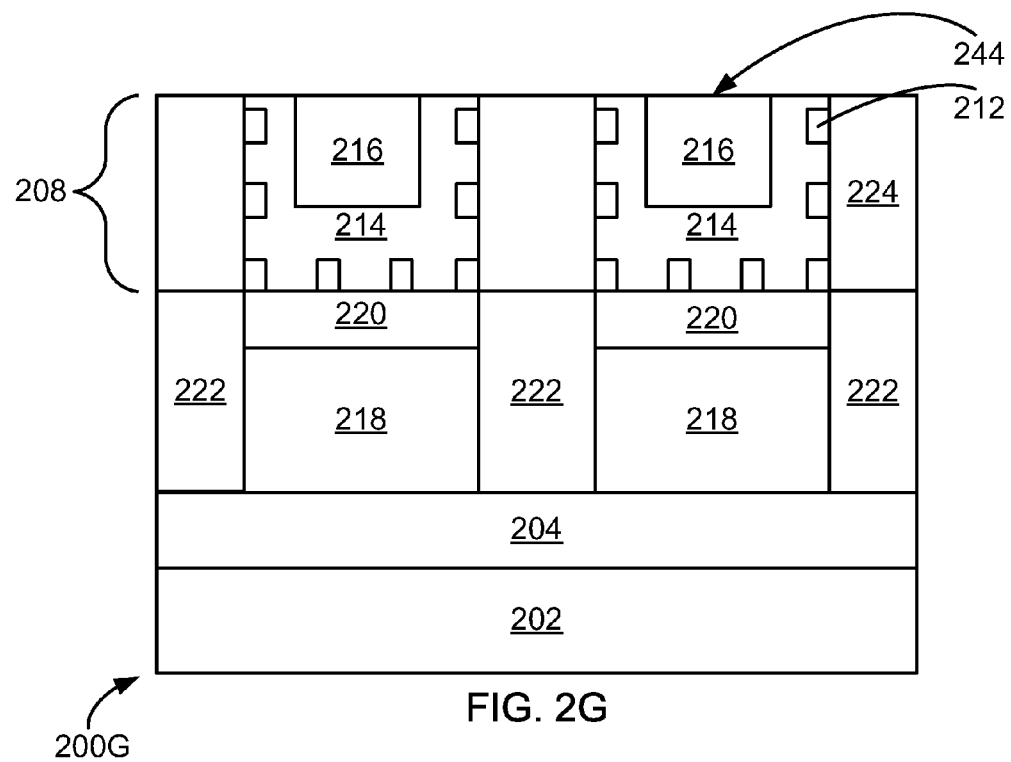

FIG. 2G shows the structure 200G after having been planarized to form a planar surface 244. On top of planarized surface 244, an optional TiN or similar adhesion layer 236 may be formed, followed by formation of a layer 230 of heavily doped semiconductor material. The heavily doped semiconductor material may be a first dopant type, such as a heavily doped p-type semiconductor layer 230 (e.g., "p+"). The semiconductor layer may include any suitable semiconductor material, including silicon, germanium, silicon germanium, etc.

Figure 2H:
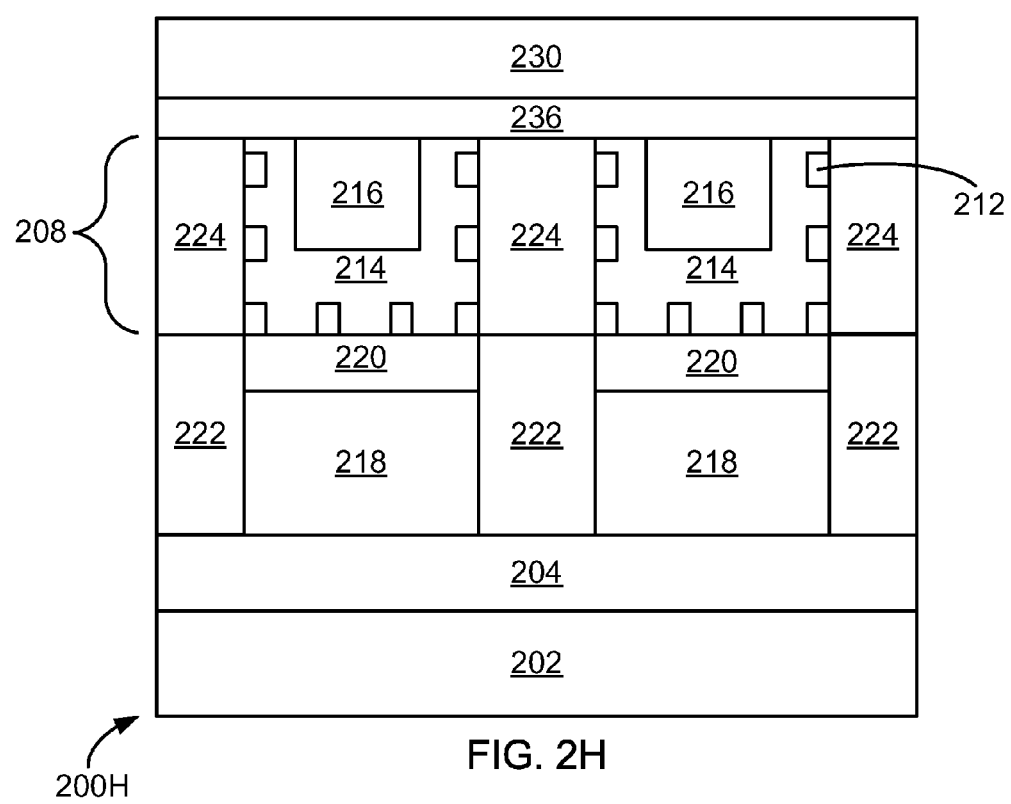
Figure 2I:
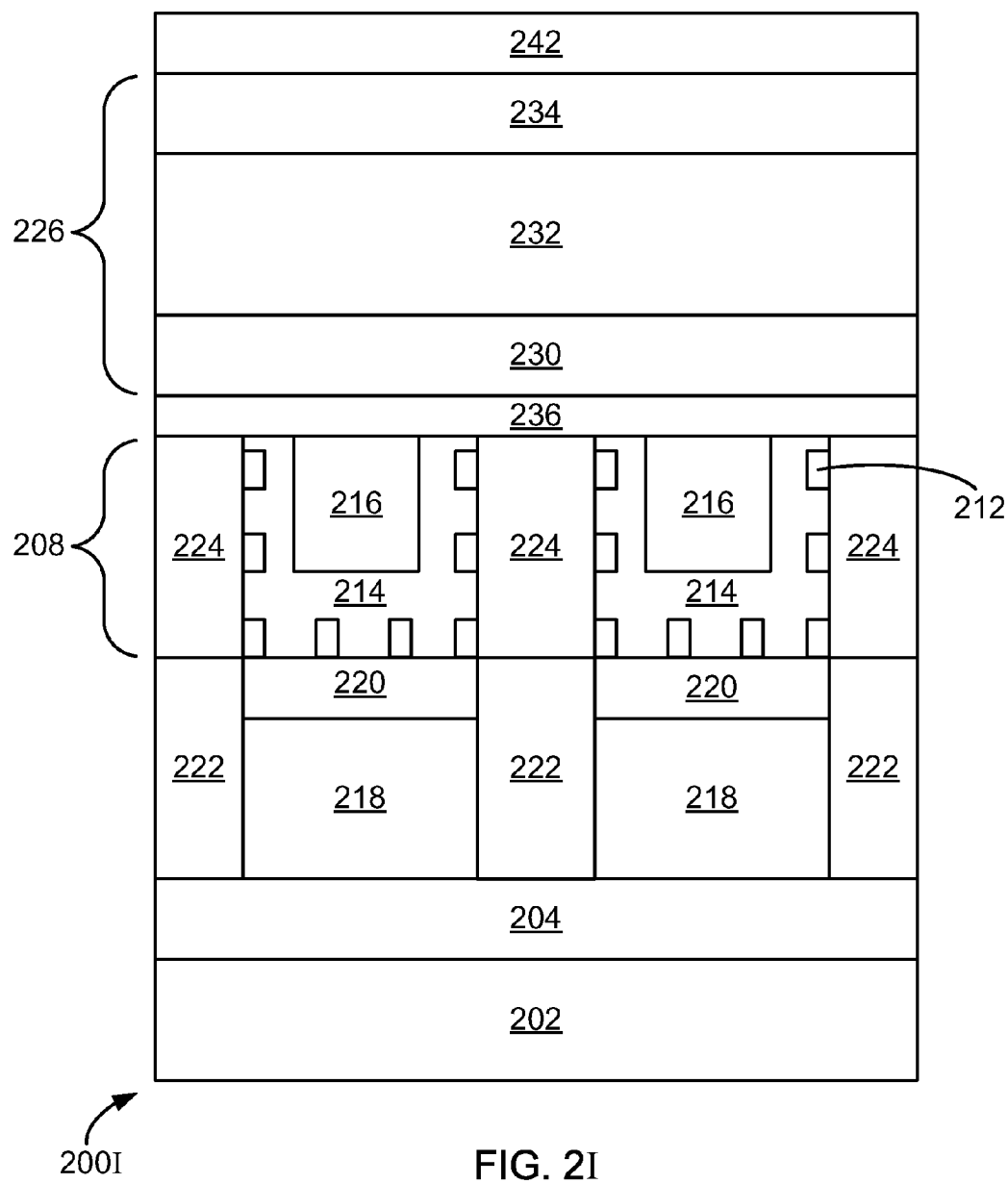

FIG. 2H depicts a structure 200H after deposition of first heavily doped semiconductor material layer 230. Building on an already flat surface of first heavily doped semiconductor material layer 230, further layers of semiconductor material may be deposited, including intrinsic or lightly doped layer 232 (e.g., i) and a second heavily doped semiconductor material layer 234 doped with a dopant of a second conductivity type, e.g., n-type ("n+"), as depicted in FIG. 2I. Furthermore, an optional layer 242 of metal silicide forming material, e.g., Ti, may be deposited above the pillar diode and below an optional upper barrier layer, e.g., capped with TiN, to act as a crystallization catalyst for the semiconductor material of the diode 226 during a later annealing process. Achieving higher order crystallization in the annealed semiconductor material may lower the resistance of the diode 226 and therefore lower the applicable programming voltages of memory cell 206.

FIG. 2I shows a structure 200I as ready to be patterned and etched to form pillar diodes 226 from p+, i, and n+ layers 230, 232, and 234, respectively, capped with Ti/TiN silicide forming layer 242. After etching, gaps between the pillars are filled with dielectric material 228 (e.g., SiO$_2$) and planarized to achieve a structure 200J depicted in FIG. 2J.

Figure 2J:
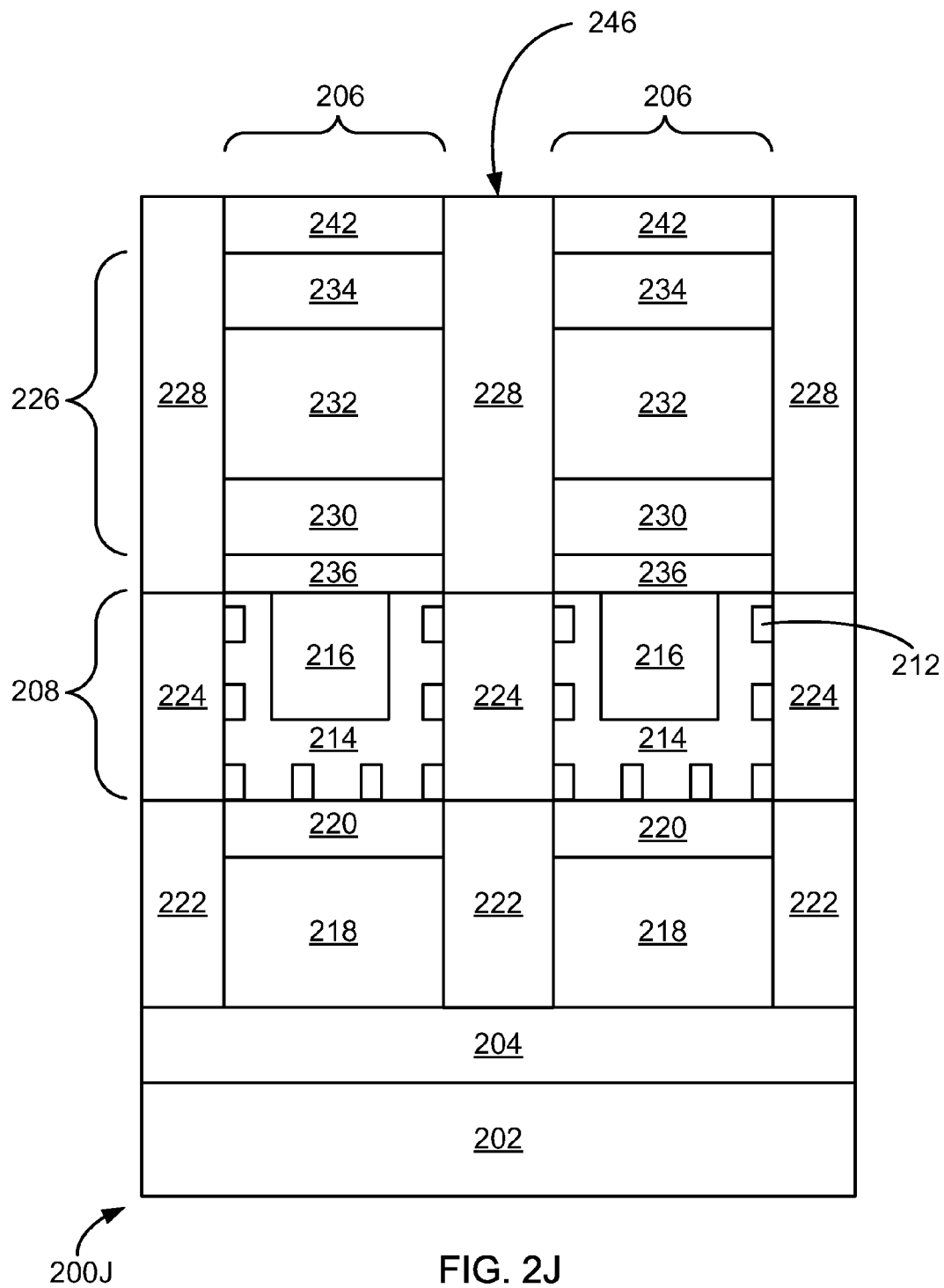

FIG. 2J depicts structure 200J after having been planarized to form a planar top surface 246. Top surface 246 of structure 200J is ready to receive the remaining layers of structure 200 of FIG. 2A, namely upper conductors 238 (e.g., W), as well as optional upper barrier layer 240 (e.g., TiN) between upper conductors 238 and pillar diodes 226.

After deposition of the optional barrier layer and upper conductors 238, these layers 238 and 240 are patterned and etched to form conductor rails preferably perpendicular to lower conductors 218. Gaps separating upper conductors 238 are filled with dielectric material (not visible or shown in FIG. 2A), and the resulting top surface is planarized to achieve structure 200 shown in FIG. 2A. Structure 200 could represent a portion of a larger two dimensional ("2D") array of memory cells 206, which in turn could form a level of a three dimensional monolithic memory array.

A monolithic three dimensional memory array is one in which multiple memory levels are formed above a single substrate, such as a wafer, with no intervening substrates. The layers forming one memory level are deposited or grown directly over the layers of an existing level or levels. Related memories are described in Herner et al., U.S. patent application Ser. No. 10/955,549, "Nonvolatile Memory Cell Without A Dielectric Antifuse Having High- And Low-Impedance States," filed Sep. 29, 2004 (the '549 application); Herner et al., U.S. patent application Ser. No. 11/148,530, "Nonvolatile Memory Cell Operating By Increasing Order In Polycrystalline Semiconductor Material," filed Jun. 8, 2005 (the '530 application); Herner et al., U.S. Pat. No. 6,952,030, "A High-Density Three-Dimensional Memory Cell" (the '030 patent); and Herner et al., U.S. Pat. No. 7,285,464, (the '464 patent); each of which is hereby incorporated by reference herein in its entirety for all purposes. To avoid obscuring the present invention, this detail will be not be reiterated in this description, but no teaching of these or other incorporated patents or applications is intended to be excluded.

Figure 3:
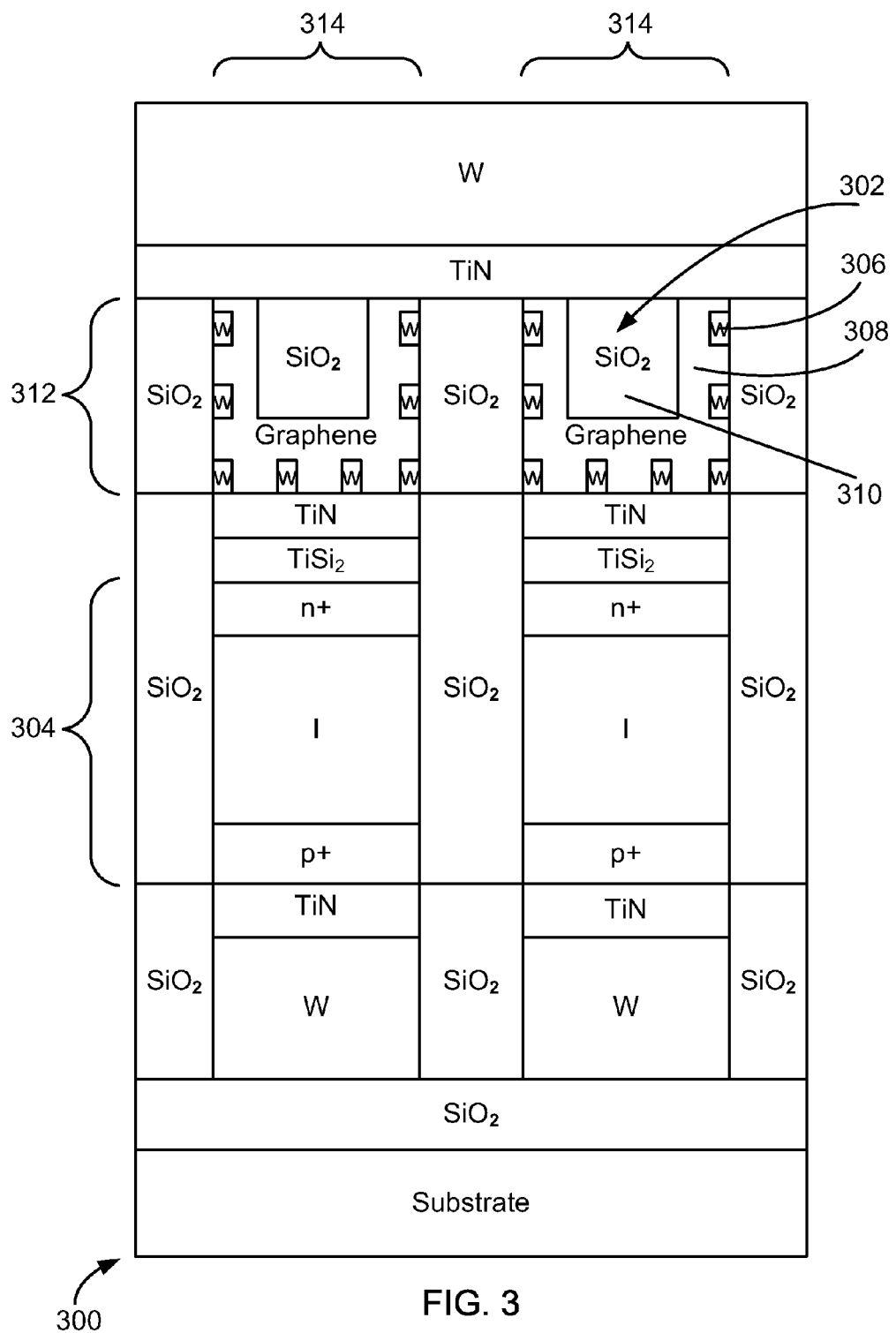
FIG. 3 is a cross-sectional, elevational view of an exemplary embodiment of memory cells similar to those of FIG. 2A and fabricated using steps similar to those shown in FIGS. 2B-2J, except that the reversible resistance-switching elements are formed above the steering elements.

FIG. 3 depicts a cross-sectional, elevational view of a memory cell structure 300 similar to that of FIG. 2A, and fabricated using steps similar to those of FIGS. 2B-2J, except that the damascene trenches or vias 302 are formed above steering elements 304, e.g., diodes 304. The damascene trenches or vias 302 likewise include metal nanoparticles 306, a CNF lining 308 and dielectric fill 310 acting as reversible resistance-switching elements 312 of memory cells 314. In some embodiments, the diodes 304 of FIG. 3 may be annealed to activate the dopants of the heavily doped semiconductor layers, prior to formation of the damascene trenches or vias 302, metal nanoparticles 306, CNF lining 308 and dielectric fill 310.

Figure 4:
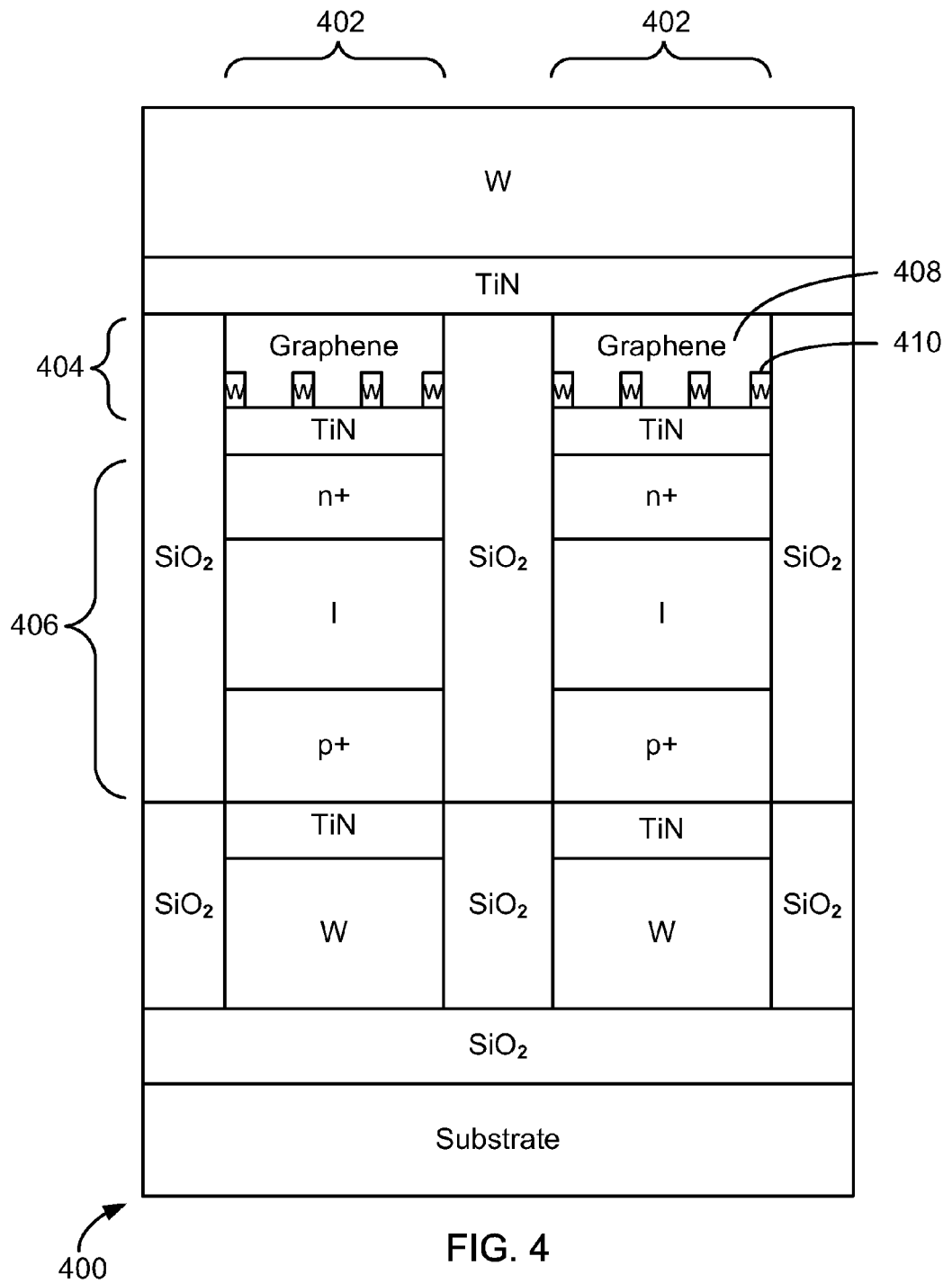
FIG. 4 is a cross-sectional, elevational view of an exemplary embodiment of memory cells similar to those of FIG. 3, except that the reversible resistance-switching elements formed above the steering elements are horizontal layers of CNF, instead of damascene trenches or vias lined with CNF and filled with dielectric, and the CNF layers are etched along with the steering elements.

FIG. 4 is a cross-sectional, elevational view of an exemplary embodiment of a microelectronic structure 400 having memory cells 402 similar to those of FIG. 3, except that reversible resistance-switching elements 404 formed above steering elements 406 are horizontal layers of graphene 408 formed above metal nanoparticles 410, instead of damascene trenches or vias having metal nanoparticles, a CNF lining and dielectric fill. Also, CNF layers 408 are etched along with the steering elements 406. Whereas the structure 300 of FIG. 3 involves planarization of the CNF layer 308, the structure 400 FIG. 4 requires etching of the CNF layer 408.

Figure 5:
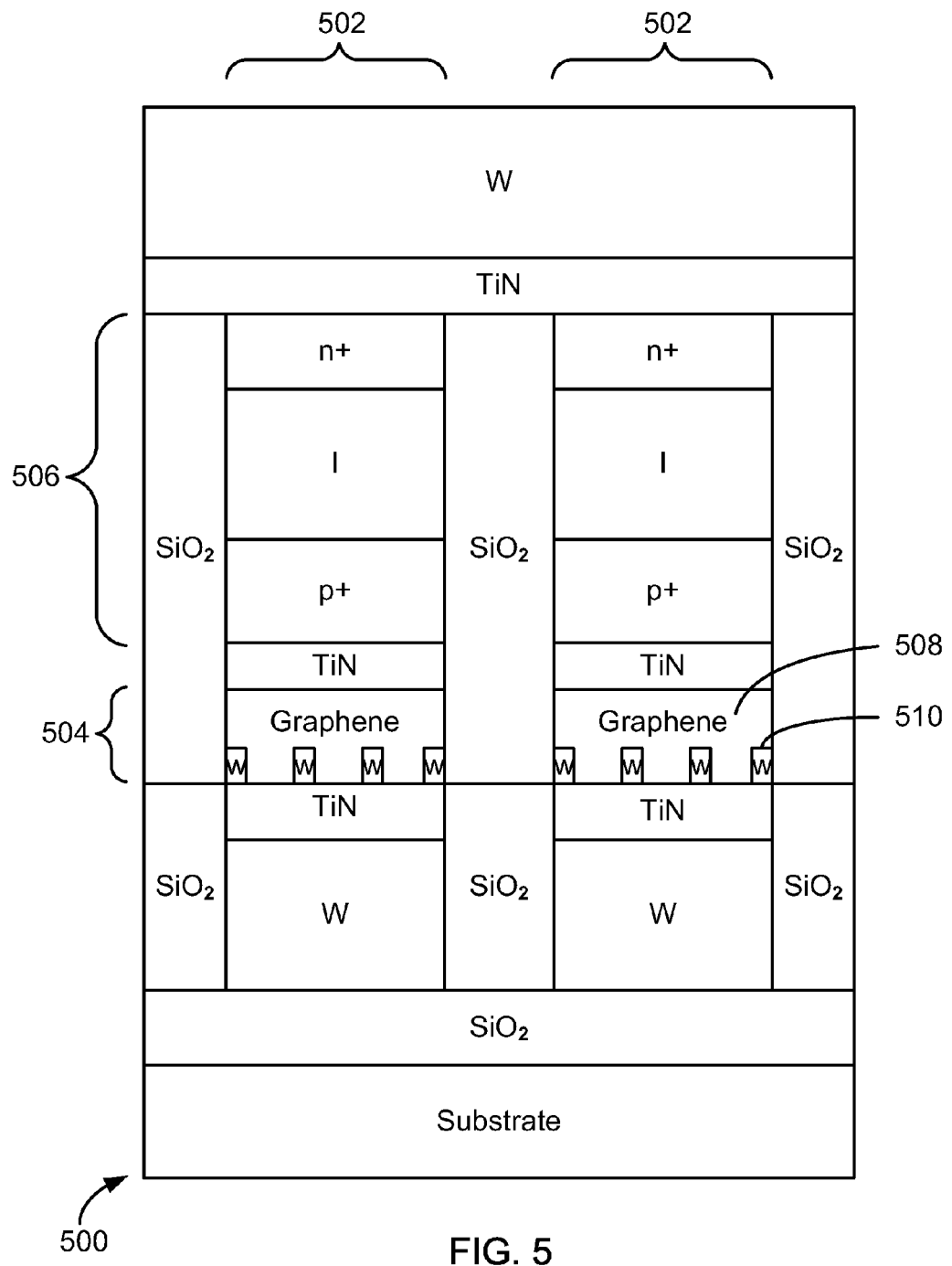
FIG. 5 is a cross-sectional, elevational view of an exemplary embodiment of memory cells similar to those of FIG. 4, except that the reversible resistance-switching elements are formed below the steering elements, as in FIG. 2A.

FIG. 5 is a cross-sectional, elevational view of an exemplary embodiment of a microelectronic structure 500 having of memory cells 502 similar to those of FIG. 4, except that reversible resistance-switching elements 504 are formed below the steering elements 506. Analogous to FIG. 4, the structure depicted in FIG. 5 requires etching of graphene layer 508 having metal nanoparticles 510.

Graphene Deposition

Growth of graphene preferably involves non-plasma-enhanced CVD-style film growth. Other techniques, such as PECVD, are suitable to grow graphene, but they do not appear to be as advantageous. For instance, use of PECVD to grow the graphene likely may result in a poorer quality of graphene as compared to CVD-style graphene. The plasma nature of PECVD might have a damaging or amorphizing effect regardless of the metallic nanoparticles. CVD-style growth of graphene on all the primarily dielectric surfaces would require higher temperatures and would occur slower than CVD-style growth of graphene on metal surfaces. The discontinuous film of metal nanoparticles on the deposition surface may reduce the overall thermal budget and processing time by facilitating faster, higher-quality CVD-style film growth at lower temperatures.

In some embodiments, growth of graphene layers preferably may be done in a conditioned deposition chamber (e.g., the graphene deposition chamber initially may be conditioned if it has not been used for the day). Although preferable in some embodiments, chamber conditioning is not necessary. Conditioning the graphene deposition chamber may occur, for instance, when working from a "cold start," e.g., start up with no prior runs during the day.

Conditioning the graphene deposition chamber may include the following exemplary, non-limiting steps:

a. The chamber heater is turned on, and a quartz deposition tube is opened to an atmospheric air environment. A preferred target temperature is about 650° C., and the chamber may take about ½ hour to heat up. The temperature may range from about 650° C. to about 850° C., but should not violate a manufacturer's rating for the items used. If necessary, clean off the receptacle, known as a boat, that will hold the substrate during deposition. The boat can be put into the quartz tube filled with air at temperatures of about 650° C. or more. This step oxidizes the carbon, and the boat may change from black to clear.

b. The tube then is closed from atmospheric air, and the tube is pumped out with a roughing pump. The bleed valve to atmospheric air is closed. The pressure changes from atmospheric to about 30 mTorr. Depending on the rating of the chamber, pressures from atmospheric down to about $1\times10^{-4}$ torr may be used. During this initial stage, some of the "head" from the gas lines may be pulled into the tube and create a flash that burns off the gas.

c. When about 30 mTorr is reached and the temperature of the furnace is stabilized, the vacuum is closed, and the acetylene and $H_2$ gasses are bled in to the chamber by opening the gas valves. A practice run preferably is run first, in which there is no sample or boat inside. The pressure changes from about 30 mTorr to about 100 T in about 1 minute. In some embodiments, the pressure is not controlled and is a function of the gasses bleeding into the tube.

d. After about 1 minute, the pump valve is opened, the chamber is pumped down to about 30 mTorr, and the valves to the acetylene and $H_2$ gasses are closed. This substantially removes the acetylene and $H_2$ gasses from the chamber.

e. When about 30 mTorr is achieved again, the valve to the pump is closed, and Ar is flowed into the quartz tube by opening the Ar gas valve. The pressure is allowed to increase steadily until atmospheric pressure is reached, and the bleed valve to air then is opened. Next, the tube is opened and is ready to be loaded with actual sample.

After conditioning the chamber, the structure with the metal nanoparticles is loaded into the graphene deposition chamber and annealed, such as in an $H_2$ environment, prior to deposition. Deposition of the graphene then occurs and may be accomplished by introducing acetylene and $H_2$, for instance, into the chamber. Graphene deposition in a conditioned chamber, e.g., a "warm start," may include the following exemplary, non-limiting steps:

a. Adjust the heater, with the tube open to an atmospheric air environment. A preferred target temperature is about 650° C., which may take about ½ hour to reach.

b. Load the structure with metal nanoparticles into the end of the boat. The boat is put into the quartz tube, but outside of the furnace.

c. Close the tube from air, e.g., the bleed valve to air is closed. The tube is pumped out with the roughing pump. The pressure changes from atmospheric to about 30 mTorr. Depending on the rating of the chamber, pressures from atmospheric down to about $1\times10^{-4}$ torr may be used.

d. Move the structure into the furnace, and allow it time to thermally equilibrate. Adjust the temperature to about 650° C. using the temperature controller. The temperature may range from about 650° C. to about 850° C., but should not violate a manufacturer's rating for the items used.

e. When about 30 mTorr is reached and the temperature of the furnace is stabilized, close the vacuum, and open the gas valves to bleed, for instance, about 150 ml/min $H_2$ into the chamber. The boat and structure, which already are inside the furnace, undergo an $H_2$ anneal, such as for about 4 minutes. The pressure might not be controlled and may be a function of the gasses bleeding into the tube.

f. After the 4-minute $H_2$ anneal, the system is pumped down to about 100 millitorr.

g. Next, close the vacuum, and open the gas valves to bleed, for instance, about 50 ml/min acetylene and about 150 ml/min $H_2$ into the chamber. The boat and structure already are inside the furnace and receive deposited graphene. A film of graphene grows as the graphene is deposited. In some embodiments, the pressure is not controlled and may be a function of the gasses bleeding into the tube.

h. After about 1 minute, remove the boat and structure from the furnace, but keep them inside the quartz tube. This stops the graphene growth.

i. Open the pump valve, pump the chamber down to about 30 mTorr, and close the valves to the acetylene and $H_2$ gasses, which substantially removes the acetylene and $H_2$ gasses from the chamber.

j. When about 30 mTorr is achieved again, close the valve to the pump, and open the Ar gas valve to flow Ar into the quartz tube. The pressure is allowed to steadily increase until atmospheric pressure is reached, at which point the bleed valve to air is opened. Back filling with Ar while the structure is cooling helps to prevent oxidation. The tube then is opened and ready to be unloaded.

Sample embodiments in accordance with the invention have been fabricated using similar graphene deposition techniques. Exemplary test data from a structure with a reversible resistivity-switching element made with metal nanoparticle-assisted graphene growth have shown high yields of reproducible switching. For instance, at room temperature and under vacuum, testing has been performed on such a structure using a read voltage of 1V, a set voltage of 6V for 1 ms, and a reset voltage of ≥16V for 1 ms. The OFF-state stabilized when using a reset bias ≥16V. Resistance of the structure consistently and reproducibly alternated between ON- and OFF-states to allow currents of about $1\times10^{-4}$ A and $1\times10^{-5}$ A, respectively.

In contrast, test substrates having conventional, commercially-similar designs, e.g., very small features amid dielectric without metal nanoparticles, were tested likewise, but they did not yield comparable results. The conventional, commercially-similar test structures had proportionally less exposed metal, and hence a proportionally smaller surface area ratio of metal to dielectric. These experimental data appear to indicate that surfaces having a higher proportion of exposed metal grow graphene better than surfaces having a lower proportion of exposed metal.

The foregoing description discloses only exemplary embodiments of the invention. Other embodiments of the invention, and modifications of the above disclosed apparatus and methods, may fall within the spirit and scope of the invention, as defined by the following claims, as will be readily apparent to those of ordinary skill in the art.

The invention claimed is:

1. A microelectronic structure comprising:
    a first conductor;
    a discontinuous film of metal nanoparticles disposed on a surface above the first conductor, wherein the discontinuous film of metal nanoparticles is formed atop a surface comprising metal surfaces and dielectric surfaces, and the dielectric surfaces comprise more surface area than the metal surfaces comprise and wherein the dielectric surfaces comprise a damascene trench or via;
    a carbon nano-film formed atop the surface and the discontinuous film of metal nanoparticles; and
    a second conductor disposed above the carbon nano-film.

2. The microelectronic structure of claim 1, wherein the carbon nano-film comprises a reversible resistance-switchable element.

3. The microelectronic structure of claim 1, further comprising a semiconductor structure.

4. The microelectronic structure of claim 1, further comprising a steering element.

5. The microelectronic structure of claim 4, wherein the steering element comprises a diode.

6. The microelectronic structure of claim 4, further comprising a memory cell.

7. The microelectronic structure of claim 6, wherein the memory cell comprises the steering element in series with a reversible resistance-switchable element, and the reversible resistance-switchable element comprises the carbon nano-film.

8. The microelectronic structure of claim 1, wherein the carbon nano-film comprises graphene.

9. A memory cell comprising:
    a first conductor;
    a discontinuous film of metal nanoparticles disposed on a surface above the first conductor, wherein the discontinuous film of metal nanoparticles is formed atop a surface comprising metal surfaces and dielectric surfaces, and the dielectric surfaces comprise more surface area than the metal surfaces comprise and wherein the dielectric surfaces comprise a damascene trench or via and the discontinuous film of metal nanoparticles is formed on sidewalls of the damascene trench or via;
    a carbon nano-film formed atop the surface and the discontinuous film of metal nanoparticles; and
    a second conductor disposed above the carbon nano-film.

10. The memory cell of claim 9, wherein the carbon nano-film comprises a reversible resistance-switchable element.

11. The memory cell of claim 9, further comprising a semiconductor structure.

12. The memory cell of claim 9, further comprising a steering element.

13. The memory cell of claim 12, wherein the steering element comprises a diode.

14. The memory cell of claim 9, further comprising a steering element in series with a reversible resistance-switchable element, wherein the reversible resistance-switchable element comprises the carbon nano-film.

15. The microelectronic structure of claim 9, wherein the carbon nano-film comprises graphene.

* * * * *